US012698554B2

(12) United States Patent (10) Patent No.: US 12,698,554 B2
Hong et al. (45) Date of Patent: Aug. 4, 2026

(54) MASK STAGE AND MASK MANUFACTURING APPARATUS HAVING THE SAME

(71) Applicant: Samsung Display Co., Ltd., Yongin-si (KR)

(72) Inventors: Kyongho Hong, Yongin-si (KR); Myungkyu Kim, Yongin-si (KR); Sungho Park, Yongin-si (KR); Chang-Kon Park, Yongin-si (KR); Sukbeom You, Yongin-si (KR); Dongjae Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 510 days.

(21) Appl. No.: 18/321,376

(22) Filed: May 22, 2023

(65) Prior Publication Data

US 2024/0076771 A1 Mar. 7, 2024

(30) Foreign Application Priority Data

Sep. 5, 2022 (KR) ......................... 10-2022-0111817

(51) Int. Cl.
*C23C 14/04* (2006.01)
*C23C 14/24* (2006.01)
(Continued)

(52) U.S. Cl.
CPC ............ *C23C 14/042* (2013.01); *C23C 14/24* (2013.01); *H10K 59/1201* (2023.02); *H10K 71/166* (2023.02)

(58) Field of Classification Search
None
See application file for complete search history.

(56) References Cited

U.S. PATENT DOCUMENTS 6,003,828 A 12/1999 Kawahashi et al.
8,361,233 B2 * 1/2013 Kwon .................. B65G 49/065
65/25.2
(Continued)

FOREIGN PATENT DOCUMENTS

CN 106545726 3/2017
CN 110699638 1/2020
(Continued)

OTHER PUBLICATIONS

Partial European search report for European Patent Application or Patent No. 23195095.7 dated Feb. 12, 2024.
(Continued)

*Primary Examiner* — Sylvia Macarthur
(74) *Attorney, Agent, or Firm* — CANTOR COLBURN LLP

(57) ABSTRACT

A mask stage includes a stage inclined with respect to a vertical direction perpendicular to a plane defined by a first direction and a second direction intersecting each other, a plurality of first support units disposed between the stage and a mask frame disposed above the stage, and a plurality of second support units disposed on the stage and being adjacent to a lower side of the mask frame. The lower side of the mask frame extends in a first direction, and the second support units are respectively disposed under end portions of the lower side of the mask frame, which are opposite to each other in the first direction.

17 Claims, 19 Drawing Sheets

(51) Int. Cl.
     *H10K 71/16*          (2023.01)
     *H10K 59/12*          (2023.01)

(56)                References Cited

U.S. PATENT DOCUMENTS

| | | | | |
|---|---|---|---|---|
| 9,657,392 | B2 | 5/2017 | Han | |
| 10,280,510 | B2 * | 5/2019 | Kurita | H01J 37/32715 |
| 10,767,253 | B2 * | 9/2020 | Zhang | B05C 21/005 |
| 2015/0211120 | A1 * | 7/2015 | Zhao | H01J 37/32623 |
| | | | | 239/461 |
| 2015/0211121 | A1 * | 7/2015 | Zhao | C23C 16/4585 |
| | | | | 118/728 |
| 2018/0033671 | A1 | 2/2018 | Gratrix et al. | |
| 2018/0345331 | A1 * | 12/2018 | Kim | C23C 14/042 |
| 2022/0064779 | A1 * | 3/2022 | Moon | H10K 71/166 |
| 2022/0140294 | A1 * | 5/2022 | Hong | H01L 21/6875 |
| | | | | 438/22 |
| 2024/0076771 | A1 * | 3/2024 | Hong | C23C 14/24 |
| 2024/0376586 | A1 * | 11/2024 | Park | C23C 14/042 |
| 2025/0008831 | A1 * | 1/2025 | Hong | H10K 59/35 |

FOREIGN PATENT DOCUMENTS

| | | | | |
|---|---|---|---|---|
| CN | 112647046 | | 4/2021 | |
| JP | 3322167 | | 9/2002 | |
| JP | 3322167 | B2 * | 9/2002 | G03F 7/2002 |
| JP | 2021143408 | A * | 9/2021 | C23C 14/34 |
| KR | 10-2015-0102454 | | 9/2015 | |
| KR | 10-1577577 | | 12/2015 | |
| KR | 10-2100446 | | 4/2020 | |
| KR | 10-2193019 | | 12/2020 | |
| KR | 10-2021-0036078 | | 4/2021 | |
| KR | 10-2021-0116250 | | 9/2021 | |
| KR | 10-2021-0126147 | | 10/2021 | |
| KR | 20210126147 | A * | 10/2021 | H01L 21/67751 |
| WO | 2018/054168 | | 3/2018 | |
| WO | WO-2020180334 | A1 * | 9/2020 | H01L 21/68742 |

OTHER PUBLICATIONS

Extended European Search Report for European Application No. 23195095.7, dated Jun. 18, 2024.

* cited by examiner

MASK STAGE AND MASK MANUFACTURING APPARATUS HAVING THE SAME

CROSS REFERENCE TO RELATED APPLICATION(S)

This application claims priority to and benefits of Korean Patent Application No. 10-2022-0111817 under 35 U.S.C. § 119, filed on Sep. 5, 2022, the entire contents of which are incorporated hereby by reference.

BACKGROUND

1. Technical Field

Embodiments relate to a mask stage and a mask manufacturing apparatus including the mask stage.

2. Description of the Related Art

In recent years, an organic light emitting diode display (OLED) is being spotlighted as a next generation display device for its superior brightness and wide viewing angle. Since the organic light emitting diode display does not include a separate light source when compared with a liquid crystal display, it is manufactured with a thin thickness and a light weight. For example, the organic light emitting diode display has properties, such as low power consumption, high brightness, fast response speed, etc.

The organic light emitting diode display includes a plurality of light emitting elements that includes an anode, a light emitting layer, and a cathode. Holes and electrons are injected into the light emitting layer through the anode and the cathode and are recombined in the light emitting layer to generate excitons. The light emitting elements emit light in case that an excited state of the excitons returns to a ground state. In case that the light emitting elements are manufactured, a mask is disposed on a substrate, and an organic material used to form the light emitting layer is provided on the substrate through openings passing through the mask.

The mask includes a mask frame having a frame shape due to a frame opening passing therethrough and a plurality of stick masks disposed on the mask frame. Openings are formed through the stick masks such that the organic material is transmitted through the openings. In case that the mask is manufactured, the mask frame is supported by a support structure, and the stick masks are connected to the mask frame. A support structure that readily supports the mask frame is required.

SUMMARY

Embodiments provide a mask stage capable of readily supporting a mask frame.

Embodiments provide a mask manufacturing apparatus including the mask stage.

However, embodiments of the disclosure are not limited to those set forth herein. The above and other embodiments will become more apparent to one of ordinary skill in the art to which the disclosure pertains by referencing the detailed description of the disclosure given below.

In an embodiment, a mask stage may include a stage inclined with respect to a vertical direction perpendicular to a plane defined by a first direction and a second direction intersecting each other, a plurality of first support units disposed between the stage and a mask frame disposed above the stage, and a plurality of second support units disposed on the stage and being adjacent to a lower side of the mask frame. The lower side of the mask frame may extend in a first direction, and the plurality of second support units may be respectively disposed on end portions of the lower side of the mask frame, which are opposite to each other in the first direction.

The mask frame may have a frame shape when viewed in a direction toward the stage, and the plurality of first support units may overlap corner portions of the mask frame The plurality of first support units may be spaced apart from edge portions of the corner portions of the mask frame and disposed in the corner portions of the mask frame when viewed in the direction toward the stage.

The plurality of first support units may not overlap the mask frame except for the corner portions of the mask frame when viewed in the direction toward the stage.

The mask frame may include: first extension portions extending parallel to each other in the first direction; and second extension portions bent from the first extension portions, extending parallel to each other in a second direction intersecting the first direction, the first extension portions and the second extension portions may form a quadrangular frame shape together, and the corner portions of the mask frame may be defined as angled portions between first extension portions and the second extension portions.

The plurality of first support units have a quadrangular shape when viewed in the direction toward the stage.

The plurality of first support units may include sides, and each of the sides of the plurality of first support units may have a length smaller than a width of each of the plurality of first extension portions and the plurality of second extension portions.

The width of each of the first extension portions and the second extension portions may be about 180 mm, and the length of each of the sides of the plurality of first support units may be about 100 mm.

The stage may be inclined at an angle from about 4 degrees to about 6 degrees with respect to the vertical direction.

Each of the plurality of first support units may include a first air hole passing therethrough.

Portions of the stage, which respectively overlap the plurality of first support units, may include a second air hole passing therethrough and overlapping the first air hole.

An air may be sprayed to the mask frame through the first and second air holes.

The mask stage may further include a coating layer coated on a surface of each of the plurality of first support units and the plurality of second support units.

The coating layer may be a diamond-like carbon coating layer, a silicon coating layer, or a fluorine coating layer.

The plurality of first support units and the plurality of second support units may include a steel material.

Each of the plurality of first support units may include four line segments corresponding to a quadrangular shape and corner portions connecting the line segments, and each of the corner portions may have a rounded shape when viewed in a direction toward the stage.

Each of the plurality of first support units may have a circular shape when viewed in a direction toward the stage.

In an embodiment, a mask stage may include a stage inclined with respect to a direction perpendicular to a plane defined by a first direction and a second direction intersecting each other, a plurality of first support units disposed between the stage and a mask frame disposed above the stage, and a plurality of second support units adjacent to a lower side of the mask frame. The mask frame may have a frame shape when viewed in a direction toward the stage, the plurality of first support units may overlap corner portions of the mask frame and the plurality of first support units may not overlap the mask frame except the corner portions of the mask frame when viewed in the direction toward the stage.

The lower side of the mask frame may extend in a direction, and the plurality of second support units may be respectively adjacent to end portions of the lower side of the mask frame, which are opposite to each other in the direction.

In an embodiment a mask manufacturing apparatus may include a first supporter including a plane defined by a first direction and a second direction intersecting the first direction, a second supporter disposed on the first supporter and inclined with respect to a third direction perpendicular to the plane, a stage disposed on a front surface of the second supporter and inclined with respect to the third direction, a plurality of first support units disposed between the stage and a mask frame disposed above the stage, and a plurality of second support units adjacent to a lower side of the mask frame. The lower side of the mask frame extends in a direction, and the plurality of second support units are respectively disposed under end portions of the lower side of the mask frame, which are opposite to each other in the direction.

According to the above, the mask stage supports the mask frame regardless of the flatness of the mask frame and reduces a frictional force between the mask frame and the support units. Thus, the mask is readily manufactured.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
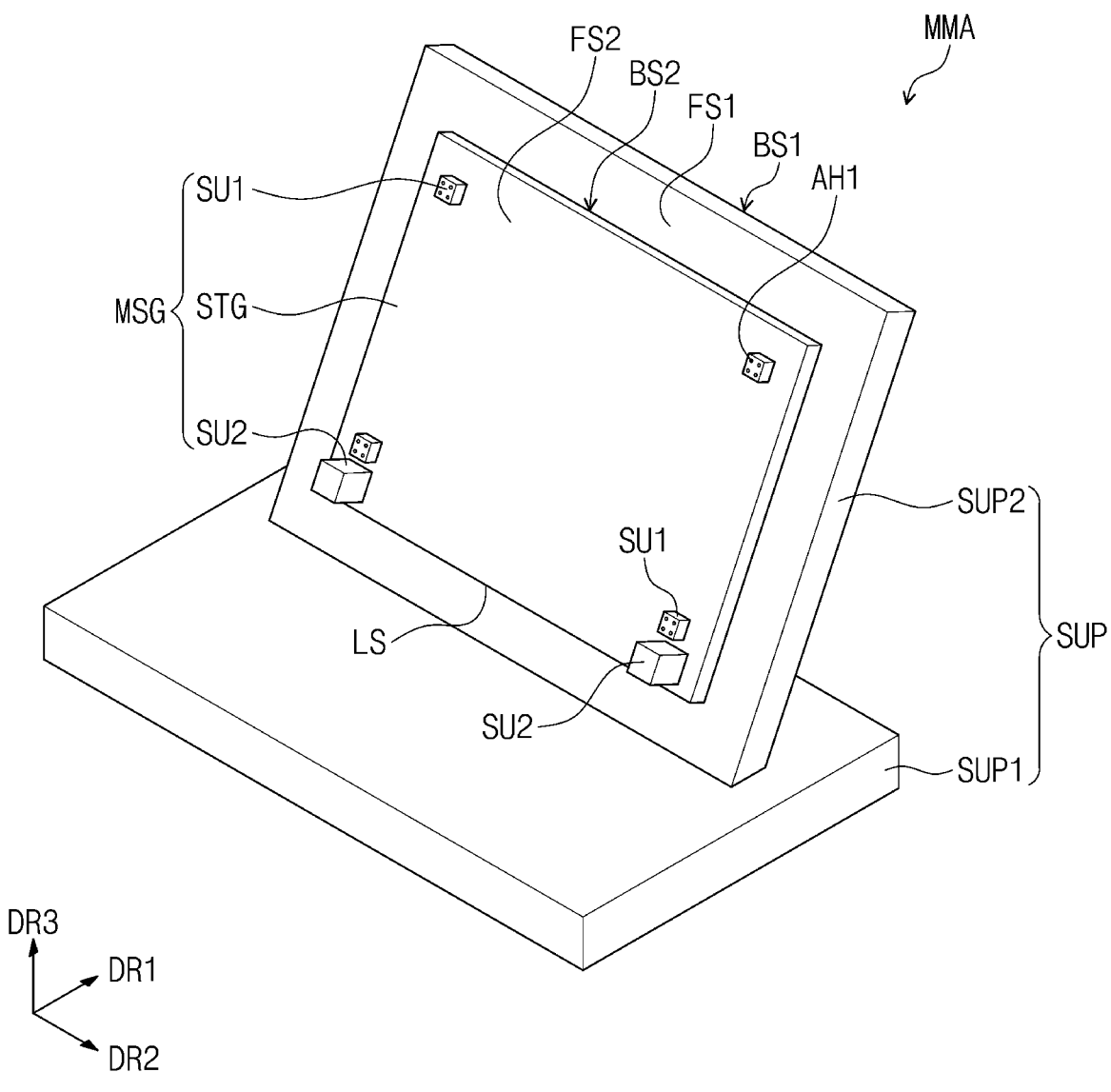
FIG. 1 is a schematic view of a mask manufacturing apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z— axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to accompanying drawings.

FIG. 1 is a schematic view of a mask manufacturing apparatus MMA according to an embodiment.

Referring to FIG. 1, the mask manufacturing apparatus MMA may include a supporter SUP and a mask stage MSG disposed on the supporter SUP. The supporter SUP may be a precision granite surface plate or a stone table.

The supporter SUP may include a first supporter SUP1 and a second supporter SUP2. The first supporter SUP1 may have a plate shape defined by a first direction DR1 and a second direction DR2 intersecting the first direction DR1. Accordingly, the first supporter SUP1 may have a plane defined by the first and second directions DR1 and DR2. The first supporter SUP1 may have a rectangular shape defined by short sides extending in the first direction DR1 and long sides extending in the second direction DR2.

Hereinafter, a direction intersecting the plane defined by the first and second directions DR1 and DR2 may be referred to as a third direction DR3. The third direction DR3 may perpendicularly intersect the plane defined by the first and second directions DR1 and DR2. In the description, the expression "when viewed in a plane" or "in a plan view" may mean a state of being viewed from the third direction DR3.

The second supporter SUP2 may be disposed on the first supporter SUP1 and may be connected to the first supporter SUP1. The second supporter SUP2 may have a rectangular plate shape, may be inclined with respect to the third direction DR3, and may be connected to the first supporter SUP1.

In case that the second supporter SUP2 includes a plane defined by the second and third directions DR2 and DR3, the second supporter SUP2 may be inclined with respect to the third direction DR3. The second supporter SUP2 may be inclined at an angle of about 4 degrees to about 6 degrees with respect to the third direction DR3. The first and second supporters SUP1 and SUP2 may include the same material.

The second supporter SUP2 may have a rectangular shape having the length in the second direction DR2 and the width in the third direction DR3 shorter than the length thereof. In case that the second supporter SUP2 is placed horizontally with respect to the third direction DR3, the second supporter SUP2 may have the rectangular shape defined by long sides extending in the second direction DR2 and short sides extending in the third direction DR3.

Hereinafter, in a state where the second supporter SUP2 is inclined, a surface of the second supporter SUP2, which faces up, is defined as a first front surface FS1, and a surface of the second supporter SUP2, which faces down, is defined as a first rear surface BS1.

The mask stage MSG may be disposed on the second supporter SUP2. The mask stage MSG may include a stage STG disposed on the second supporter SUP2, first support units SU1 disposed on the stage STG, and second support units SU2 disposed on the stage STG.

The stage STG may have a rectangular plate shape and may be inclined with respect to the third direction DR3. For example, the stage STG may be inclined with respect to a direction (e.g., the third direction DR3) perpendicular to the plane. The stage STG may be disposed on the first front surface FS1 of the second supporter SUP2 and may be fixed to the first front surface FS1.

In a state where the stage STG includes a plane defined by the second and third directions DR2 and DR3, the stage STG may be inclined with respect to the third direction DR3. The stage STG may be inclined at an angle from about 4 degrees to about 6 degrees with respect to the third direction DR3 as in the case of the second supporter SUP2.

The stage STG may have a rectangular shape having the length in the second direction DR2 and the width in the third direction DR3 shorter than the length thereof. As an example, in case that the stage STG is placed horizontally with respect to the third direction DR3, the stage STG may have the rectangular shape defined by long sides extending in the second direction DR2 and short sides extending in the third direction DR3.

Hereinafter, in a state where the stage STG is inclined, a surface of the stage STG, which faces up, is defined as a second front surface FS2, and a surface of the stage STG, which faces down, is defined as a second rear surface BS2. The second rear surface BS2 of the stage STG may be fixed to the first front surface FS1.

The first support units SU1 and the second support units SU2 may be disposed on the second front surface FS2 of the stage STG. The first and second support units SU1 and SU2 may be fixed to the stage STG. As an example, the first and second support units SU1 and SU2 may be fixed to the stage STG by fastening units such as screws, however, members used to fix the first and second support units SU1 and SU2 to the stage STG are not limited to the screws.

The first support units SU1 may be arranged adjacent to corner portions of the stage STG, respectively. The corner portions of the stage STG may be defined as bent portions, e.g., corner portions, at which the long sides are connected to the short sides of the stage STG. As an example, four first support units SU1 may be arranged adjacent to four corner portions of the stage STG, respectively.

The second support units SU2 may be arranged adjacent to a lower side LS of the stage STG, which faces a ground. The second support units SU2 may be closer to the lower side LS than the first support units SU1 are.

The lower side LS of the stage STG may extend in the second direction DR2. The second support units SU2 may be arranged adjacent to end portions (e.g., opposite end portions) of the lower side LS, which are opposite to each other in the second direction DR2. As an example, two second support units SU2 may be arranged adjacent to end portions (e.g., opposite end portions) of the lower side LS, respectively.

The first support units SU1 may include first air holes AH1 passing therethrough. The first air holes AH1 may pass through each of the first support units SU1. The first air holes AH1 may pass through the first support units SU1. The first air holes AH1 will be described in detail below.

The stage STG may include invar. The first and second support units SU1 and SU2 may include steel.

Figure 2:
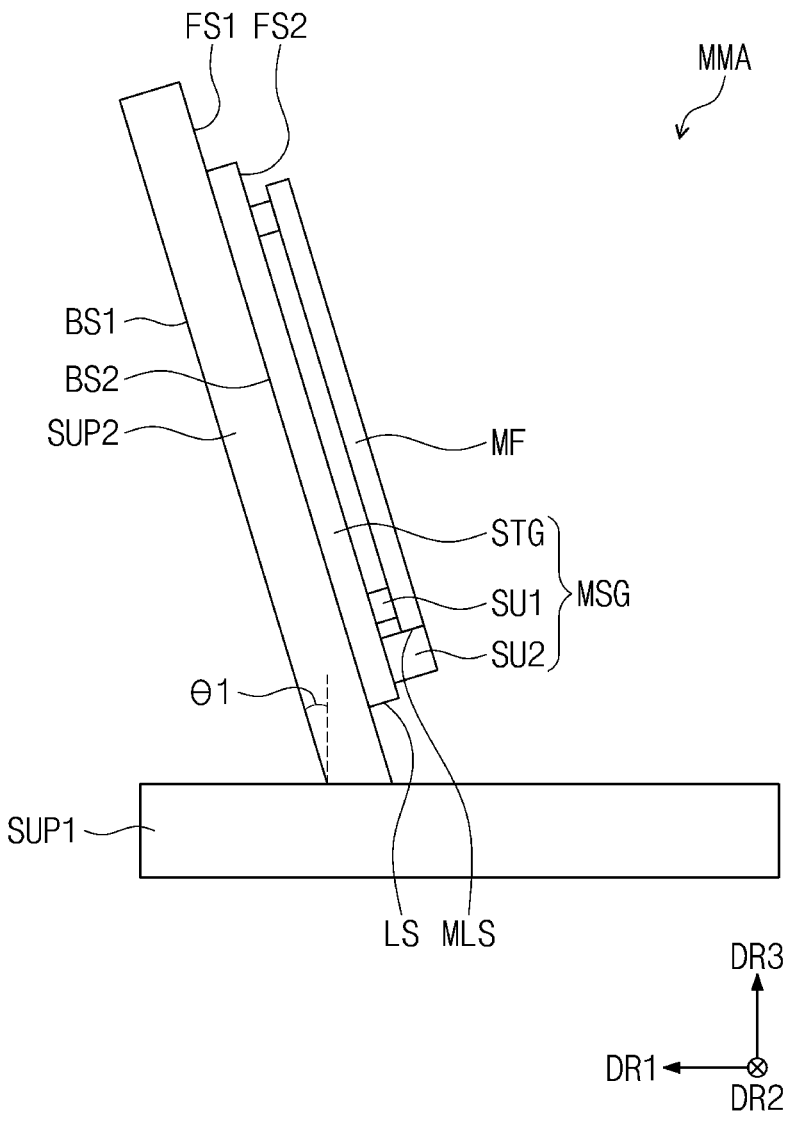
FIG. 2 is a schematic view of a mask frame disposed on a mask stage shown in FIG. 1.

FIG. 2 is a schematic view of a mask frame MF disposed on the mask stage MSG shown in FIG. 1.

As an example, FIG. 2 shows a side surface of the mask manufacturing apparatus MMA when viewed in the second direction DR2. For example, the second supporter SUP2 and the stage STG are shown as being inclined with respect to the third direction DR3.

Referring to FIGS. 1 and 2, the mask frame MF may be disposed above the stage STG. The mask frame MF may be disposed above the second front surface FS2.

The first support units SU1 may be disposed between the stage STG and the mask frame MF. The mask frame MF may be disposed on the first support units SU1. The first support units SU1 may support the mask frame MF. The mask frame MF may include a metal material. As an example, the mask frame MF may include invar or stainless steel.

The mask frame MF may be in contact with front surfaces of the first support units SU1. Accordingly, a frictional force may exist between the mask frame MF and the first support units SU1.

The second support units SU2 may be disposed under a lower side MLS of the mask frame MF, which faces the ground. The lower side MLS of the mask frame MF may be arranged adjacent to the lower side LS of the stage STG. The second support units SU2 may support the lower side MLS of the mask frame MF.

The second supporter SUP2 and the stage STG may be inclined at a predetermined angle θ1 with respect to the third direction DR3. As described above, the predetermined angle θ1 may be set to an angle from about 4 degrees to about 6 degrees.

In the case where the second supporter SUP2 and the stage STG are arranged parallel to the third direction DR3 and perpendicular to the plane defined by the first and second directions DR1, the mask frame MF may not be stably placed on the mask stage MSG. The mask stage MSG may be inclined at the predetermined angle θ1 with respect to the third direction DR3 to allow the mask frame MF to be stably placed on the mask stage MSG.

Figure 3:
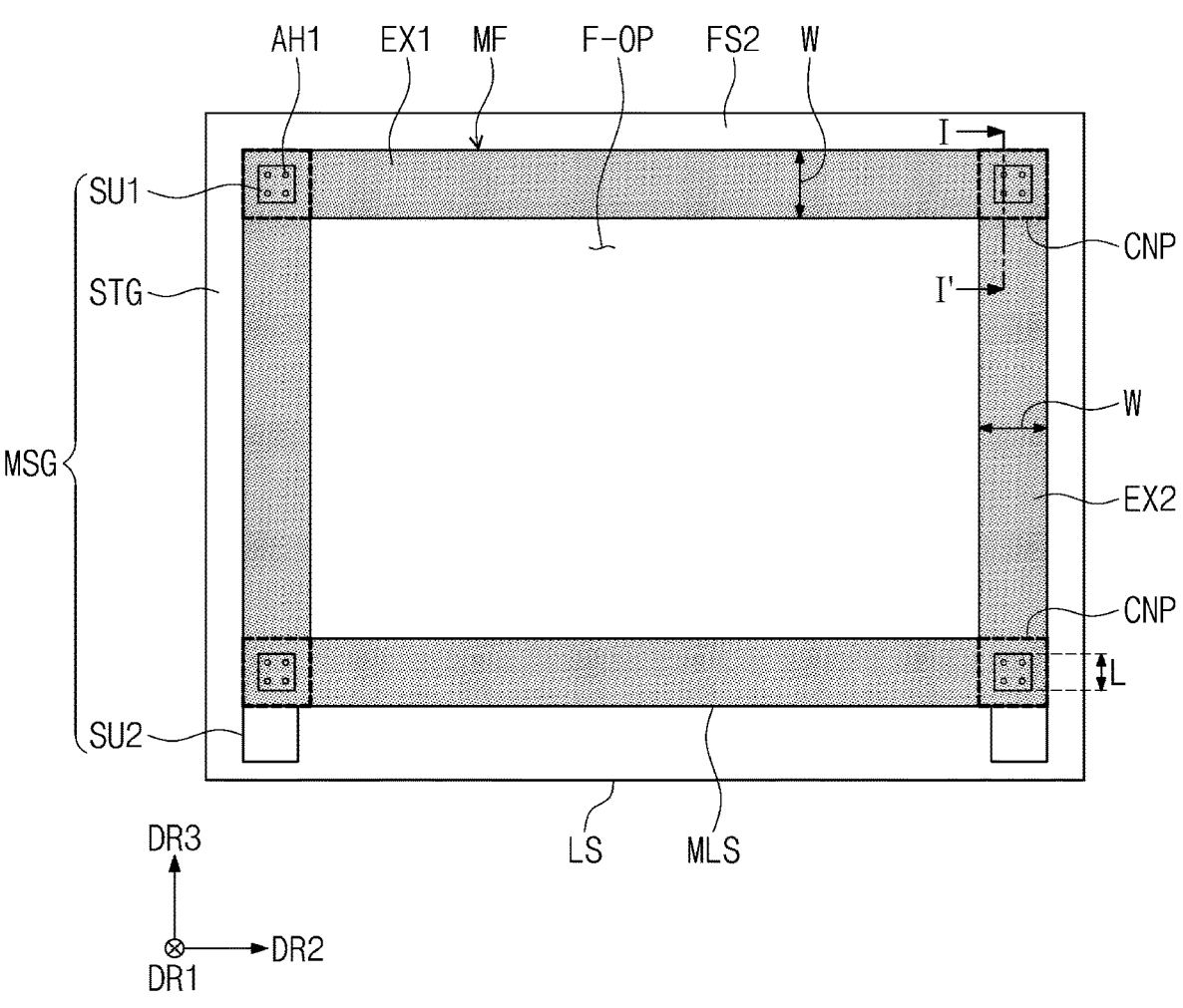
FIG. 3 is a schematic plan view of a mask stage and a mask frame when viewed in a direction toward a second front surface of a stage shown in FIG. 2.

FIG. 3 is a schematic plan view of the mask stage MSG and the mask frame MF when viewed in a direction toward the second front surface FS2 of the stage STG shown in FIG. 2.

Referring to FIG. 3, when viewed in the direction toward the second front surface FS2 of the stage STG, the mask frame MF may have a rectangular frame shape. The mask frame MF may be provided with a frame opening F-OP passing therethrough and having a rectangular shape.

The mask frame MF may include corner portions CNP corresponding to bent portions of the frame shape. Since the mask frame MF has a rectangular frame shape, four corner portions CNP may be defined at the mask frame MF. The corner portions CNP may be arranged respectively adjacent to corner portions of the stage STG.

Hereinafter, details of the components of the mask stage MSG and the mask frame MF will be described based on a state in which they are disposed parallel to the second direction DR2 and the third direction DR3.

The mask frame MF may include first extension portions EX1 extending parallel to each other in the second direction DR2 and facing each other in the third direction DR3 and second extension portions EX2 extending parallel to each other in the third direction DR3 and facing each other in the second direction DR2. The second direction DR2 may be referred to as a direction, and the third direction DR3 may be referred to as another direction intersecting the direction.

The second extension portions EX2 may be bent from end portions of the first extension portions EX1 and may extend in the third direction DR3. For example, the first extension portions EX1 may be bent from end portions of the second extension portions EX2 and may extend to the second direction DR2. The first extension portions EX1 and the second extension portions EX2 may define the rectangular frame shape of the mask frame MF. The corner portions CNP may correspond to angled portions between the first extension portions EX1 and the second extension portions EX2.

Each of the first extension portions EX1 may have a width W that is equal to a width W of each of the second extension portions EX2. For example, a width of a component may be defined as a value measured in a direction intersecting an extension direction of the component. Accordingly, the width W of each of the first extension portions EX1 may be defined as a value measured in the third direction DR3, and the width W of each of the second extension portions EX2 may be defined as a value measured in the second direction DR2.

In case that the first extension portions EX1 extend in the second direction DR2 and the second extension portions EX2 extend in the third direction DR3 in the mask frame MF, the end portions of the first extension portions EX1 may overlap the end portions of the second extension portions EX2 in portions indicated by bold dotted lines. The portions indicated by the bold dotted lines may be defined as the corner portions CNP.

The corner portions CNP may be defined as a quadrangular area. The corner portions CNP may have a square shape in which a length of a side is equal to the width W in each bent portion of the mask frame MF.

When viewed in the direction toward the second front surface FS2 of the stage STG, the first support units SU1 may be arranged to respectively overlap the corner portions CNP. As an example, four first support units SU1 may respectively overlap the four corner portions CNP.

When viewed in the direction toward the second front surface FS2 of the stage STG, the first support units SU1 may be arranged in the corner portions CNP and may be spaced apart from edge portions of the corner portions CNP. When viewed in the direction toward the second front surface FS2 of the stage STG, the first support units SU1 may not overlap portions of the mask frame MF except the corner portions CNP. For example, the first support units SU1 may be arranged to overlap only the corner portions CNP.

When viewed in the direction toward the second front surface FS2 of the stage STG, the first support units SU1 may have a rectangular shape. Each of the first support units SU1 may have a square shape including each side having a length L smaller than the width W of each of the first and second extension portions. When viewed in the direction toward the second front surface FS2, the first support units SU1 may have a size smaller than a size of the corner portions CNP and may be arranged in the corner portions CNP, respectively.

As an example, each of the first and second extension portions EX1 and EX2 may have the width W of about 180 mm. The length of each of sides of the first support units SU1 may be about 100 mm. In an embodiment, the first support units SU1 may have the square shape, however, embodiments are not limited thereto or thereby. According to an embodiment, the first support units SU1 may have a rectangular shape.

The lower side MLS of the mask frame MF may extend in the second direction DR2. The second support units SU2 may be arranged adjacent to end portions (e.g., opposite end portions) of the lower side MLS, which are opposite to each other in the second direction DR2. The second support units SU2 may respectively support the end portions (e.g., opposite end portions) of the lower side MLS of the mask frame MF.

The second support units SU2 may be disposed under the end portions (e.g., opposite end portions) in the second direction DR2 of the lower side MLS, respectively. The second support units SU2 may be disposed only under the end portions (e.g., opposite end portions) of the lower side MLS and may not be disposed under the other portion of the lower side MLS.

Figure 4A:
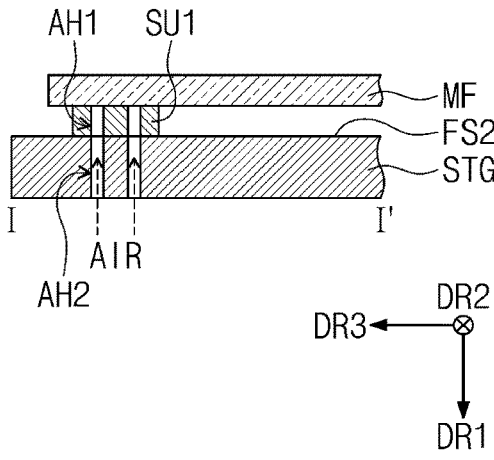
FIGS. 4A and 4B are schematic cross-sectional views taken along a line I-I' shown in FIG. 3.
Figure 4B:
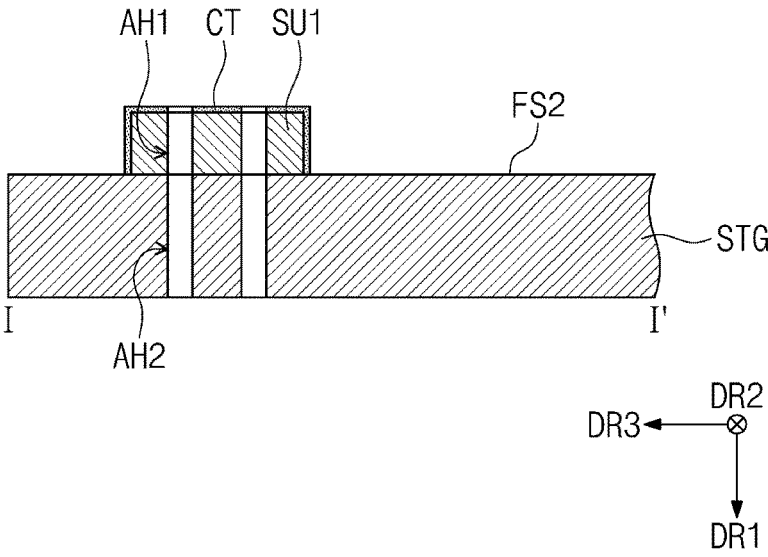

FIGS. 4A and 4B are schematic cross-sectional views taken along a line I-I' shown in FIG. 3.

FIG. 4 shows the mask frame MF with the stage STG and the first support unit SU1, and the mask frame MF is omitted in FIG. 4B.

Referring to FIGS. 3 and 4A, first air holes AH1 may pass through each of the first support units SU1. At least one first air hole AH1 may pass through each of the first support units SU1. The first air holes AH1 may be formed through the first support units SU1 along a direction perpendicular to the second front surface FS2.

When viewed in the direction toward the second front surface FS2, second air holes AH2 may pass through portions of the stage STG, which overlap the first support units SU1. At least one second air hole AH2 may pass through the portions of the stage STG, which overlap the first support units SU1. The second air holes AH2 may overlap the first air holes AH1. The second air holes AH2 may be formed through the stage STG along the direction perpendicular to the second front surface FS2.

The mask frame MF may be disposed on the first support units SU1 but may not be fixed to the first support units SU1. In the case where the mask frame MF is fixed to the first support units SU1, it may be difficult to deform the mask frame MF in case that a deformation process, which will be described below, is performed on the mask frame MF. Accordingly, the mask frame MF may be placed on the first support units SU1 without being fixed to the first support units SU1.

In case that the deformation process is performed on the mask frame MF, the mask frame MF may move by a predetermined distance on the first support units SU1. Accordingly, it is required to reduce a frictional force between the mask frame MF and the first support units SU1 to readily perform the deformation process on the mask frame MF. In case that the frictional force between the mask frame MF and the first support units SU1 is high, it may be difficult to move the mask frame MF on the first support units SU1.

The first and second air holes AH1 and AH2 may be used to reduce the frictional force between the mask frame MF and the first support units SU1. An air AIR may be sprayed to the mask frame MF via the first and second air holes AH1 and AH2.

Due to the air AIR, the mask frame MF may be separated from the front surface of the first support units SU1 by a small gap. The frictional force between the mask frame MF and the first support units SU1 may be reduced by the air AIR sprayed to the mask frame MF, and thus, a mobility of the mask frame MF may increase.

Referring to FIGS. 3 and 4B, a coating layer CT may be coated on a surface of each of the first support units SU1. The coating layer CT may reduce the frictional force. For example, the coating layer CT may be disposed on the surface of each of the first support units SU1, and FIG. 4B is an enlarged view showing the coating layer CT for the convenience of explanation.

The coating layer CT may be a diamond-like carbon coating layer, a silicon coating layer, or a fluorine coating layer. As the coating layer CT is coated on the surface of the first support units SU1, the frictional force between the first support units SU1 and the mask frame MF may be reduced. Accordingly, the mobility of the mask frame MF disposed on the first support units SU1 may increase.

For example, the coating layer CT may be coated on a surface of each of the second support units SU2.

Figure 5A:
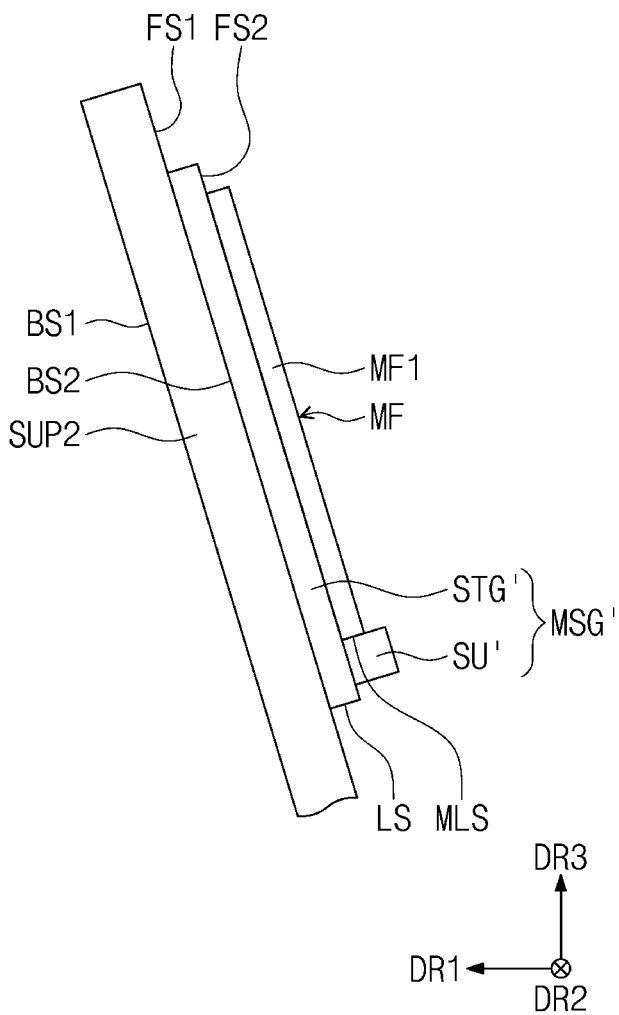
FIGS. 5A and 5B are schematic views of an arrangement state of mask frames disposed on a mask stage when first support units shown in FIG. 2 are not used.
Figure 5B:
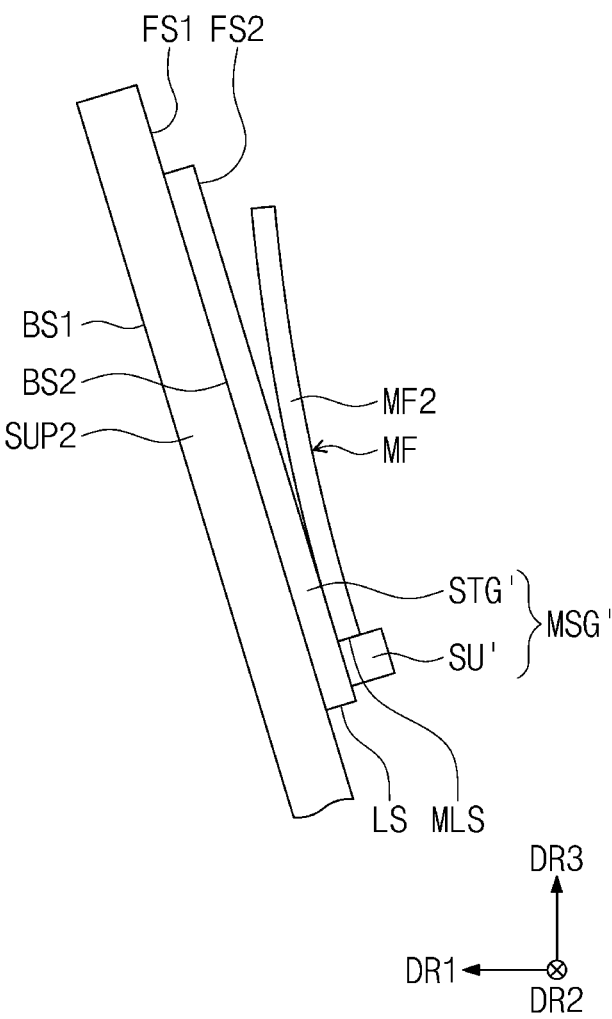

FIGS. 5A and 5B are schematic views of an arrangement state of mask frames MF1 and MF2 disposed on a mask stage MSG' in case that the first support units shown in FIG. 2 are not used.

As an example, FIGS. 5A and 5B are side views corresponding to FIG. 2, and for the convenience of explanation, the first supporter SUP1 is omitted.

Referring to FIGS. 5A and 5B, the mask stage MSG' may include a stage STG' disposed on a second supporter SUP2 and a support unit SU' disposed on the stage STG'. The support unit SU' may be adjacent to a lower side LS of the stage STG'.

A flatness of the mask frame MF may vary. As an example, mask frames MF may be consecutively arranged on the mask stage MSG' with performing a mask manufacturing process, and the mask frames MF may not have the same flatness.

The flatness may be defined as a distance between the lowest point and the highest point of the mask frame MF in case that the mask frame MF is placed flat. As the flatness becomes higher, the mask frame MF may be flatter. As the flatness becomes lower, the mask frame MF may be formed to be more curved.

Referring to FIG. 5A, the mask frame MF1 may be disposed on a flat second front surface FS2. 1 The mask frame MF1 having the relatively high flatness may be stably placed on the flat second front surface FS2.

Referring to FIG. 5B, the mask frame MF2 may be disposed on a flat second front surface FS2. The mask frame MF2 shown in FIG. 5B has a relatively low flatness. In case that the flatness is low, a curvature of the mask frame MF2 may be formed larger than a size of the mask frame MF1.

The mask frame MF2 having the low flatness may not be stably placed on the flat second front surface FS2. Since the curvature is large, only a portion of the mask frame MF2 may be in contact with the second front surface FS2.

Figure 6A:
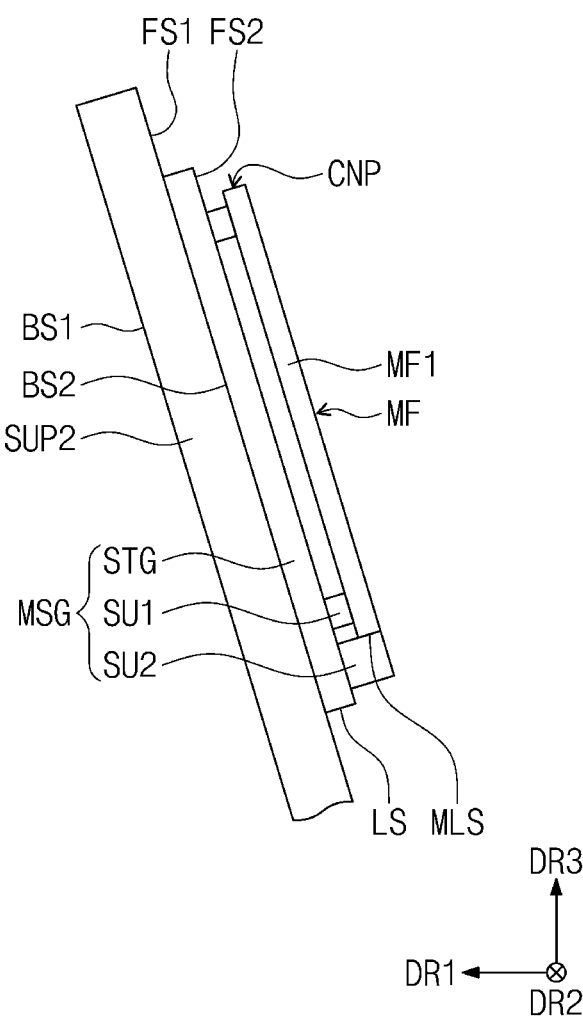
FIGS. 6A and 6B are schematic views of an arrangement state of mask frames with various flatness characteristics disposed on the mask stage shown in FIG. 2.
Figure 6B:
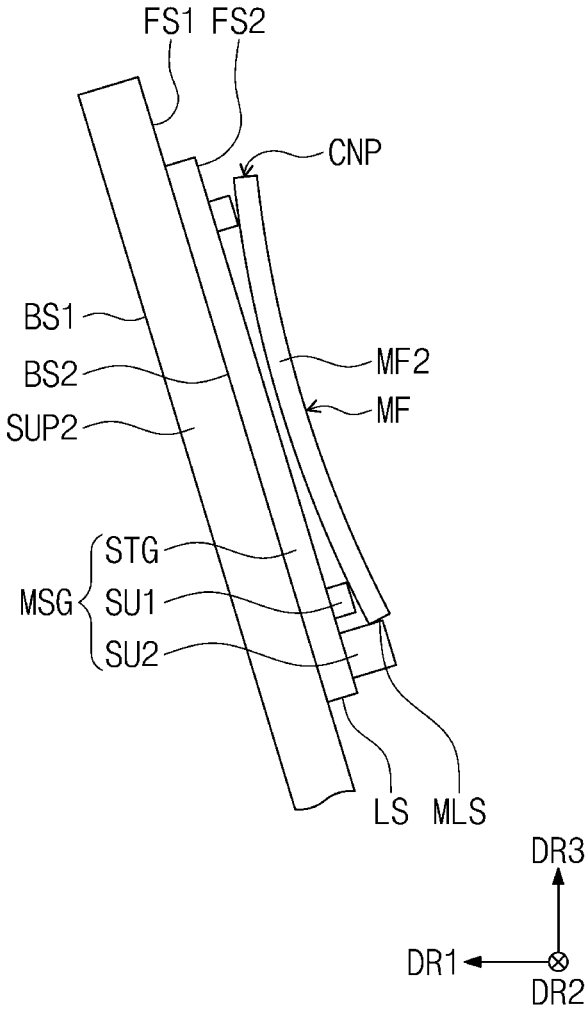

FIGS. 6A and 6B are schematic views of an arrangement state of mask frames MF1 and MF2 with various flatness characteristics disposed on the mask stage shown in FIG. 2.

As an example, FIGS. 6A and 6B are side views corresponding to FIG. 2, and for the convenience of explanation, the first supporter SUP1 is omitted. For example, the mask frames MF1 and MF2 shown in FIGS. 6A and 6B may be the mask frames MF1 and MF2 shown in FIGS. 5A and 5B.

Referring to FIGS. 3 and 6A, the mask frame MF1 may be disposed on the first support units SU1. The mask frame MF1 having the high flatness may be stably placed on the first support units SU1. As an example, the first support units SU1 may be disposed under the corner portions CNP of the mask frame MF1, and the first support units SU1 may stably support the four corner portions CNP.

Referring to FIGS. 3 and 6B, the mask frame MF2 may be disposed on the first support units SU1. The mask frame MF2 having the low flatness may be stably placed on the first support units SU1. As an example, the first support units SU1 may be disposed under the corner portions CNP of the mask frame MF2, and the first support units SU1 may stably support the four corner portions CNP.

Even though the curvature of the mask frame MF2 is large, a curved portion of a center portion of the mask frame MF2 may not be in contact with the second front surface FS2 since only the four corner portions CNP are supported. Accordingly, the mask frames MF1 and MF2 may be stably placed on the first support units SU1 regardless of the flatness of the mask frames MF1 and MF2.

Figure 7:
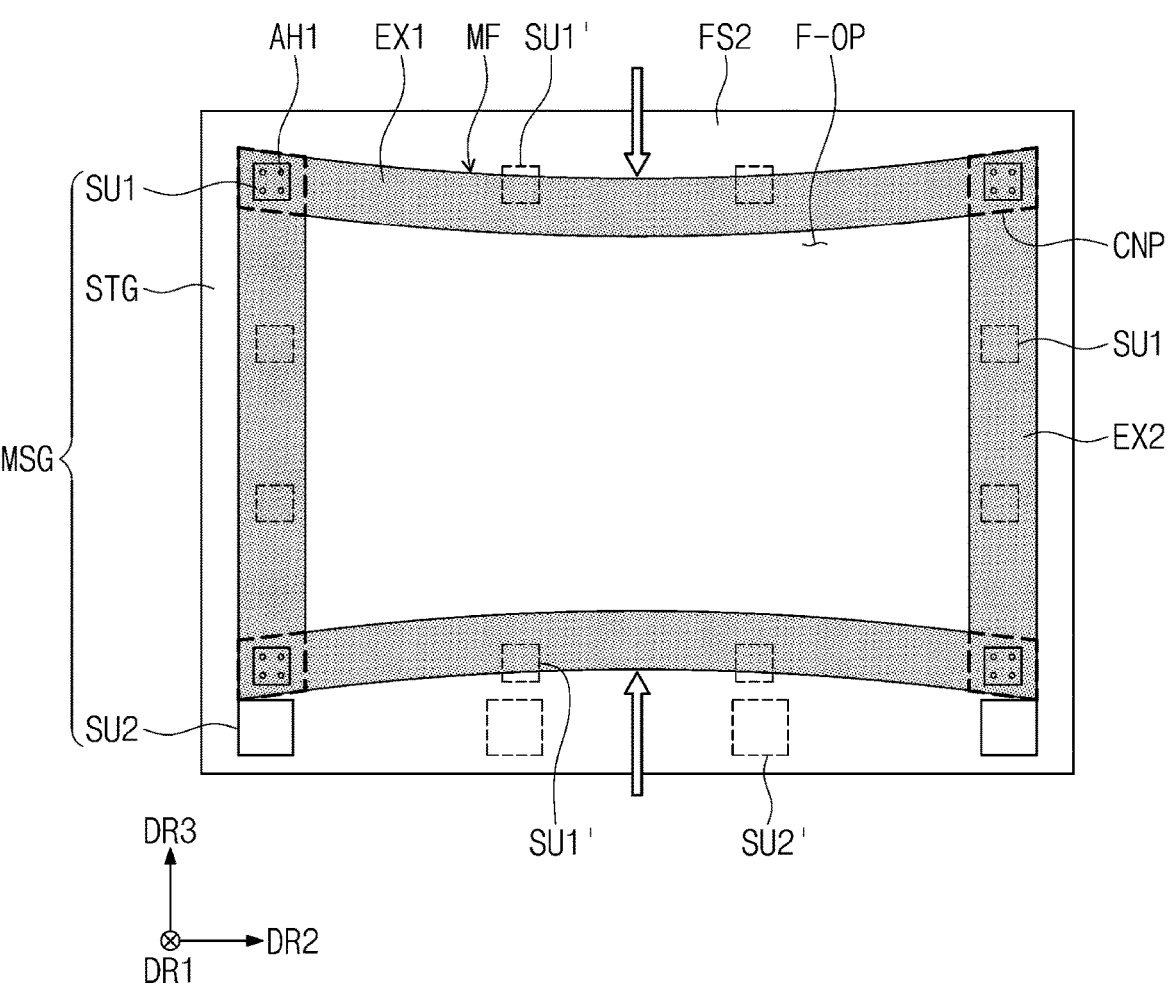
FIG. 7 is a schematic view of a deformation process of the mask frame shown in FIG. 3.

FIG. 7 is a schematic view to illustrate a deformation process of the mask frame shown in FIG. 3.

Referring to FIG. 7, the mask frame MF may be deformed before stick masks (shown in FIGS. 8 and 9) is connected to the mask frame MF. The first extension portions EX1 of the mask frame MF may be bent toward each other in third direction DR3. The first extension portions EX1 may be bent concavely toward each other.

For example, pressure members used to press the first extension portions EX1 to the third direction DR3 may press the first extension portions EX1. The first extension portions EX1 may be maintained in the pressed state by the pressure members. Accordingly, the first extension portions EX1 may maintain the bent state without being restored to its original shape. The reason why a bending process, i.e., the deformation process, is performed on the first extension portions EX1 will be described in detail below.

The frictional force between the mask frame MF and the first and second support units SU1 and SU2 may be reduced by the air AIR sprayed through the first and second air holes AH1 and AH2 and the coating layer CT. Accordingly, the first extension portions EX1 may be readily bent without being affected by the frictional force between the mask frame MF and the first and second support units SU1 and SU2.

In case that the frictional force is reduced, the mask frame MF may move outside of the first and second support units SU1 and SU2. For example, the mask frame MF may be turned over. For example, stoppers may be arranged around the first and second support units SU1 and SU2 and may restrict the movement of the mask frame MF so that the mask frame MF may not move outside the first and second support units SU1 and SU2.

First support units SU1' may be further disposed between the first and second extension portions EX1 and EX2 and the stage STG in addition to the first support units SU1. In case that the first support units SU1' are further used, the number of the support units may increase, and a contact area between the support units and the mask frame MF may increase.

As the contact area increases, the frictional force against the mask frame MF may increase. In the case where the frictional force against the mask frame MF increases by the first support units SU1 and SU1', the mobility of the mask frame MF may be reduced, and thus, the deformation process for the mask frame MF may not be readily performed.

After a process with respect to an h-th mask frame MF is performed, a process with respect to an (h+1)th mask frame MF may be performed, and a process with respect to an (h+2)th mask frame MF may be performed. The h-th, (h+1)th, and (h+2)th mask frames MF may have different flatness. For example, the h-th, (h+1)th, and (h+2)th mask frames MF may have different curved shapes from each other.

Since the h-th, (h+1)th, and (h+2)th mask frames MF are curved differently from each other, the h-th, (h+1)th, and (h+2)th mask frames MF may not be in contact with the same support units. As an example, the h-th mask frame MF may be in contact with the first support units SU1, left first support units SU1' disposed under the first extension portions EX1, and the first support units SU1' disposed under a right second extension portion EX2 according to its bent state. The (h+1)th mask frame MF may be in contact with the first support units SU1, right first support units SU1' disposed under the first extension portions EX1, and the first support units SU1' disposed under a left second extension portion EX2 according to its bent state.

In a case where contact portions are different from each other, the frictional force may be different. As an example, the frictional force applied to the h-th mask frame MF may be different from the frictional force applied to the (h+1)th mask frame MF. For example, a deviation in the frictional force with respect to the mask frames MF may increase. In case that the frictional force applied to the h-th mask frame MF is different from the frictional force applied to the (h+1)th mask frame MF, the bent state of the h-th mask frame MF may be different from the bent state of the (h+1)th mask frame MF during the bending process for the first extension portions EX1. Accordingly, the masks may not be uniformly manufactured.

According to an embodiment, since the first support units SU1 are arranged only on the corner portions CNP, the mask frame MF may be sufficiently supported at the four corner portions. For example, since the number of first support units SU1 disposed only on the corner portions CNP is optimized, the frictional force with respect to the mask frame MF may be reduced.

The first support units SU1 may not be disposed under the first and second extension portions EX1 and EX2 except for the corner portions CNP, and the first support units SU1 may be in contact with only the corner portions CNP. In case that the first support units SU1 are disposed on the corner portions CNP, the contact portions between the support units and the mask frames may become uniform. Accordingly, the deviation of the frictional force may be reduced.

In case that the deviation of the frictional force is reduced, the bent state of the h-th mask frame MF may be similar to the bent state of the (h+1)th mask frame MF during the bending process for the first extension portions EX1. Accordingly, the masks may be manufactured uniformly.

Second support units SU2' may be further disposed below the mask frame MF in addition to the second support units SU2. For example, the second support units SU2 and the second support units SU2' may not be exactly aligned along the second direction DR2. As an example, it may be more difficult to exactly align four points, e.g., four second support units SU2 and SU2', along the second direction DR2 than to exactly align two points, e.g., two second support units SU2, along the second direction DR2.

According to an embodiment, the second support units SU2 may be readily aligned along the second direction DR2 and may support end portions (e.g., opposite end portions) of the mask frame MF at a lower side.

Figure 8:
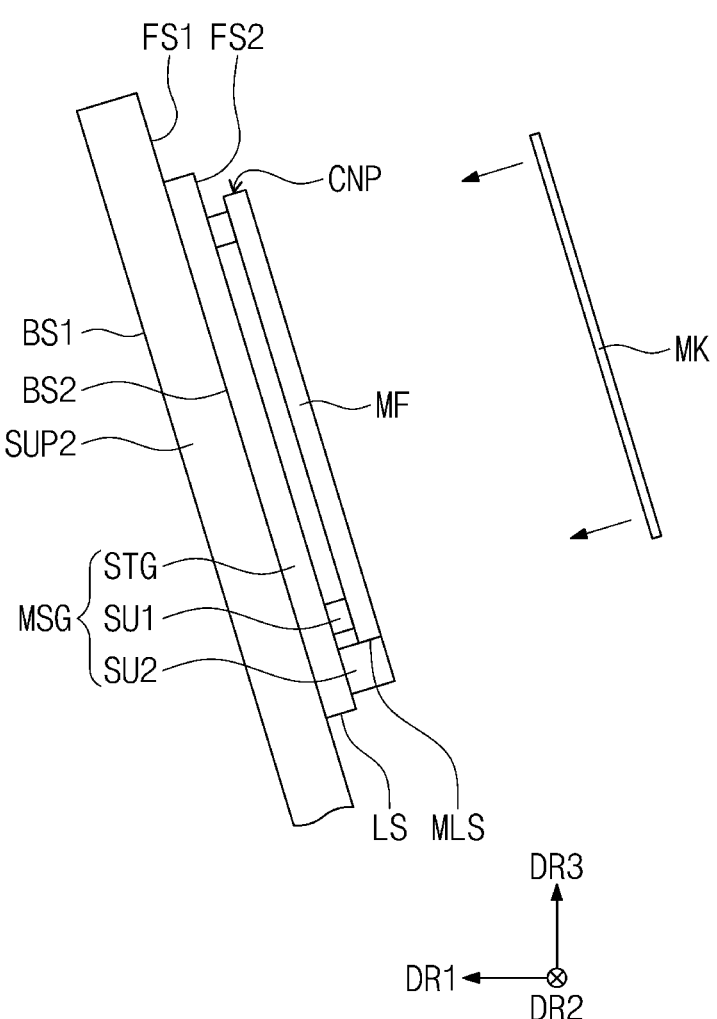
FIG. 8 is a schematic view of a stick mask disposed on the mask frame after a bending process is performed on the mask frame in FIG. 7.
Figure 9:
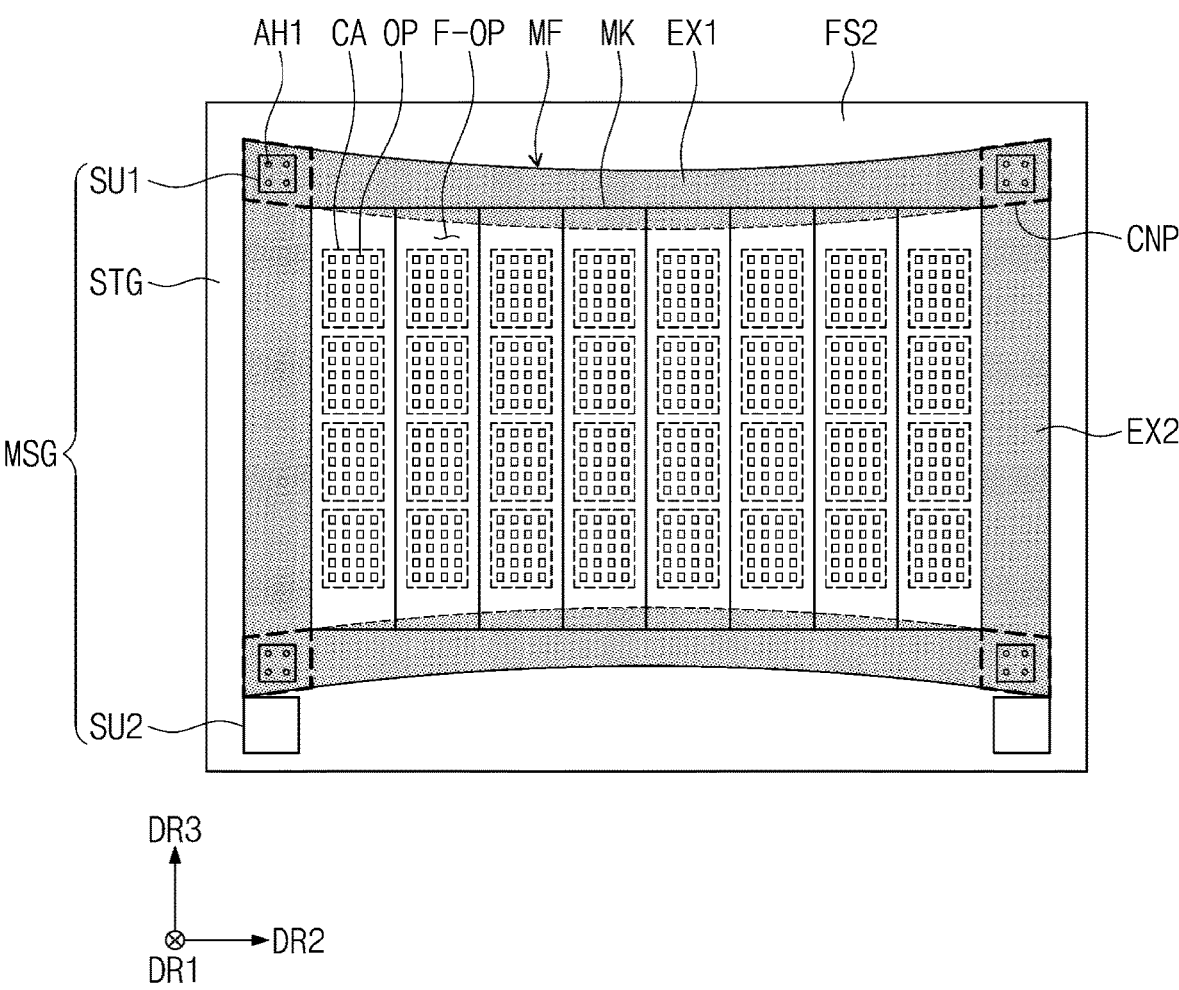
FIG. 9 is a schematic view of stick masks connected to the mask frame after the bending process is performed on the mask frame in FIG. 7.

FIG. 8 is a schematic view of the stick mask disposed on the mask frame after the bending process is performed on the mask frame in FIG. 7. FIG. 9 is a schematic view of the stick masks connected to the mask frame after the bending process is performed on the mask frame in FIG. 7.

As an example, FIG. 8 is a side view corresponding to FIG. 2, and FIG. 9 is a plan view corresponding to FIG. 3.

Referring to FIG. 8, the stick mask MK may be disposed on the mask frame MF. The stick mask MK may be provided in plural on the mask frame MF.

Referring to FIG. 9, the stick masks MK may extend in the third direction DR3 and may be arranged in the second direction DR2. The stick masks MK may include an invar or stainless steel. The stick masks MK may have a rectangular shape that extends longer in the third direction DR3. The stick masks MK may have a bar shape extending in the third direction DR3.

Each of the stick masks MK may include cell areas CA. openings OP may be formed in each of the cell areas CA. The openings OP may be arranged in a matrix form along the second and third directions DR2 and DR3. The openings OP may function as a passage through which a deposition material described below passes. When viewed in the direction toward the second front surface FS2, the cell areas CA may overlap the frame opening F-OP.

The stick masks MK may be connected to the mask frame MF. As an example, the stick masks MK may be connected to the mask frame MF by welding. For example, the mask manufacturing apparatus MMA may include a welding device to weld the stick masks MK to the mask frame MF. End portions (e.g., opposite end portions) of the stick masks MK, which are opposite to each other in the third direction DR3, may be connected to the mask frame MF. The stick masks MK may be connected to the first extension portions EX1.

The stick masks MK may be connected to the mask frame MF, and a mask MSK may be manufactured. For example, the mask MSK may include the mask frame MF and the stick masks MK disposed on the mask frame MF.

The stick masks MK are required to be flat. As described above, the first extension portions EX1 may be bent concavely toward each other. After the stick masks MK are connected to the mask frame MF, the pressure members used to maintain the first extension portions EX1 in the bent state may be removed. A restoring force may be generated in the first extension portions EX1. The stick masks MK may be stretched in the third direction DR3 and may be spread flat due to the restoring force generated in the first extension portions EX1.

FIGS. 10 to 13 are views of shapes of first support units according to embodiments.

As an example, FIGS. 10 to 13 are plan views corresponding to FIG. 3.

Figure 10:
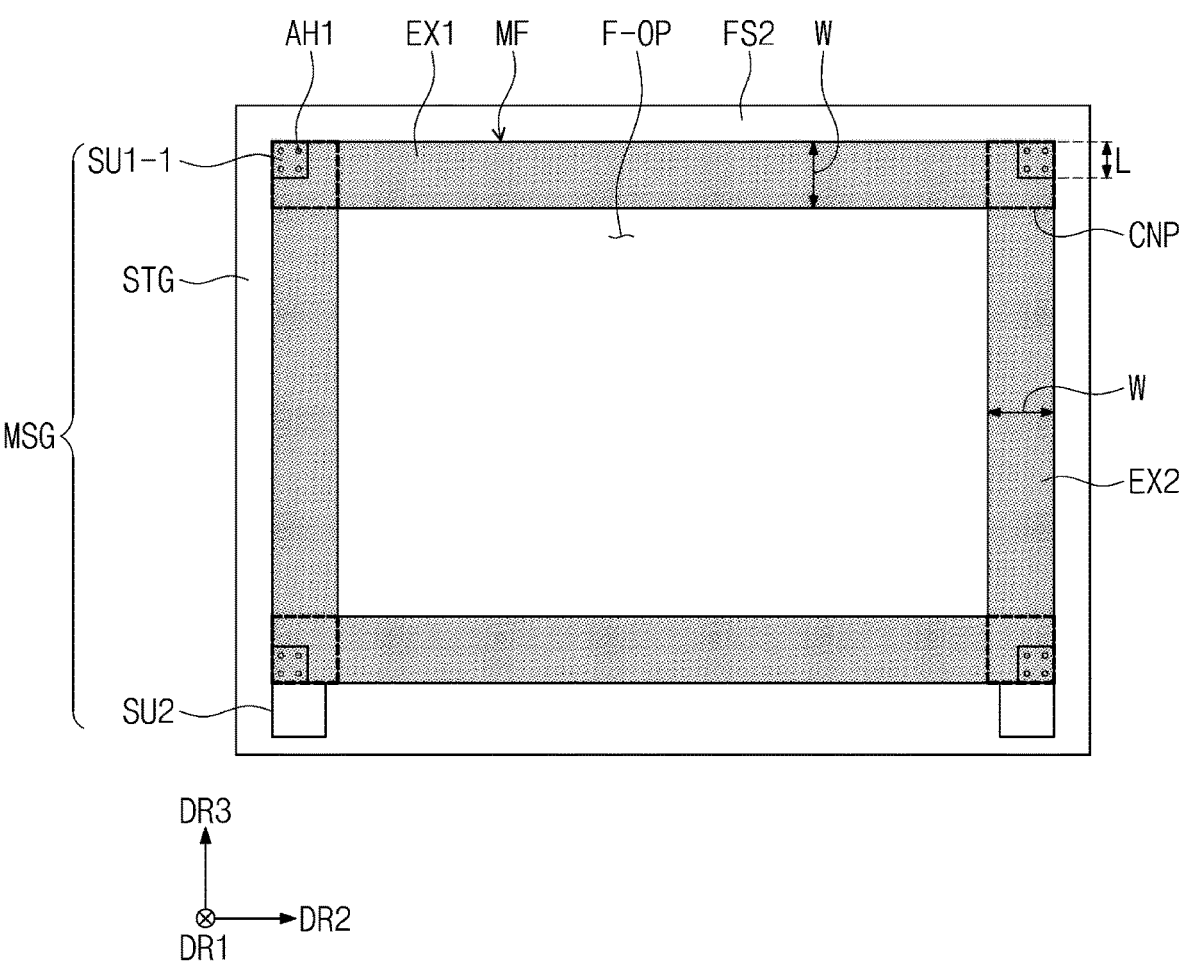
FIGS. 10 to 13 are schematic views of shapes of first support units according to embodiments.

Referring to FIG. 10, first support units SU1-1 may have a rectangular shape. The first support units SU1-1 may be placed at various positions of corner portions CNP. As an example, when viewed in a direction toward a second front surface FS2, some sides of first support units SU1-1 may be arranged to overlap external edge portions of the corner portions CNP, respectively. Each of the sides of the first support units SU1-1 may have a length L smaller than a width W of each of first and second extension portions EX1 and EX2.

Figure 11:
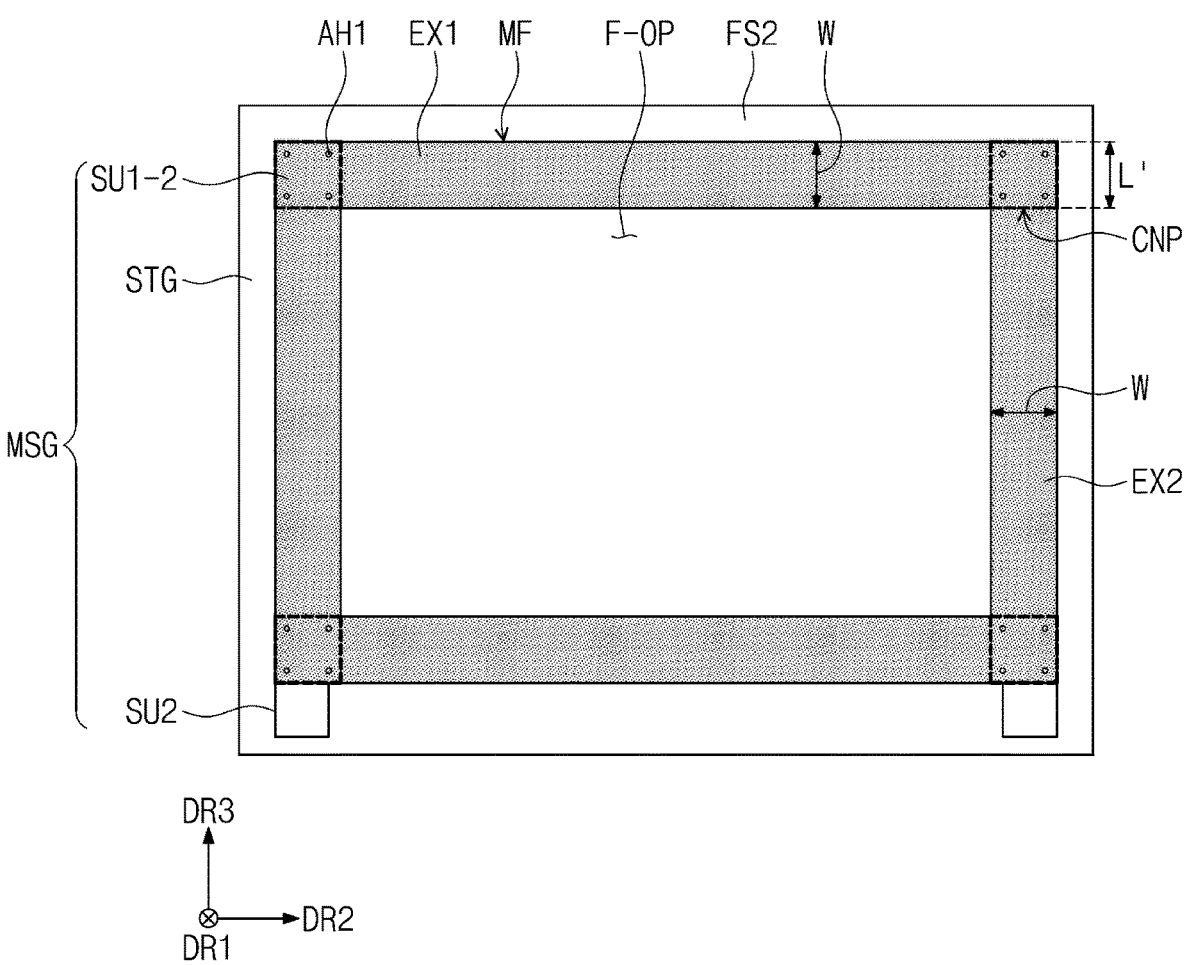

Referring to FIG. 11, first support units SU1-2 may have a rectangular shape. The first support units SU1-2 may have various sizes under a condition in which the first support units SU1-2 have the size smaller than or equal to that of corner portions CNP.

As an example, a length L' of each of sides of the first support units SU1-2 and a width W of each of first and second extension portions EX1 and EX2 may be the same as each other. For example, the first support units SU1-2 and the corner portions CNP may have the same size as each other. When viewed in a direction toward a second front surface FS2, the sides of the first support units SU1-2 may be arranged to overlap edge portions of the corner portions CNP, respectively.

Figure 12:
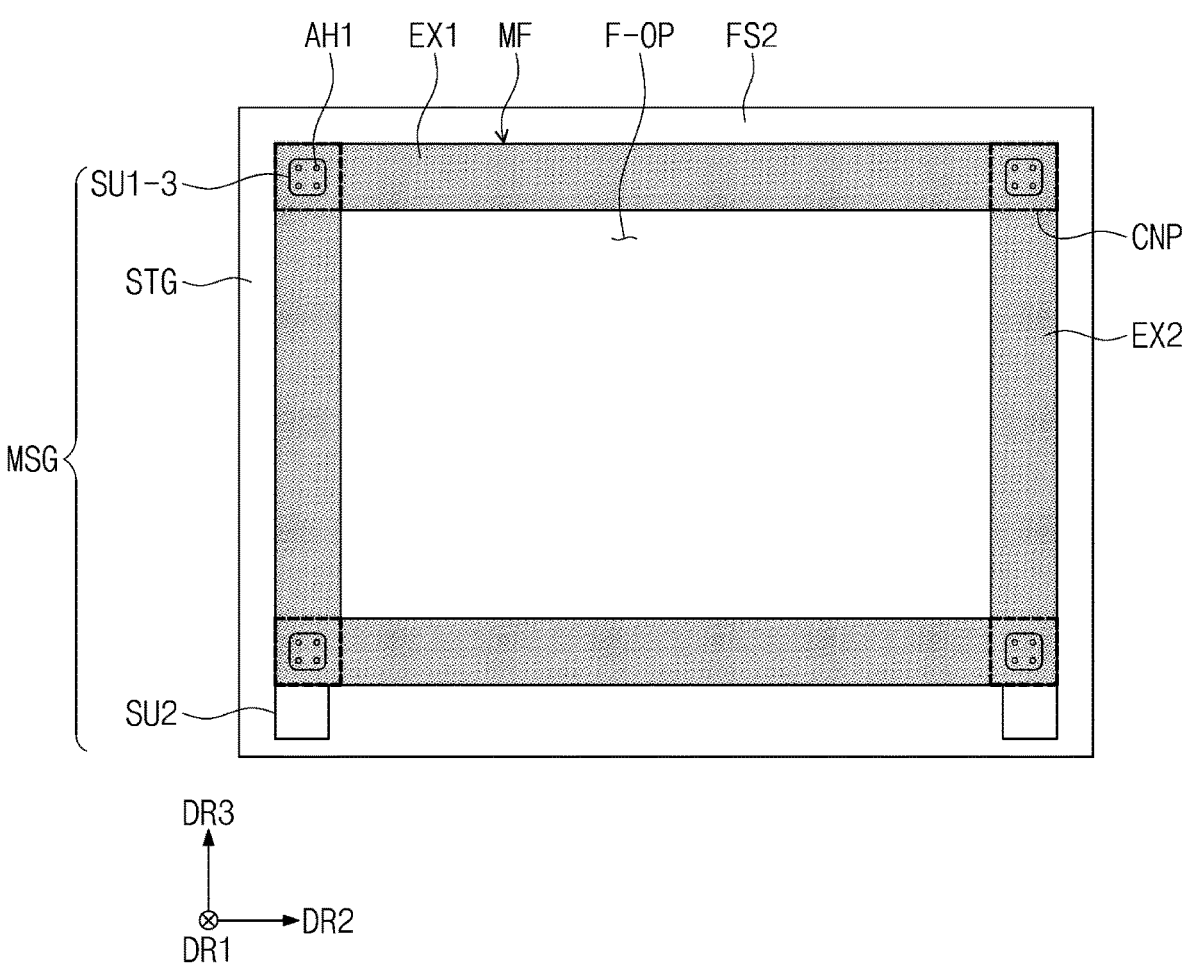

Referring to FIG. 12, when viewed in a direction toward a second front surface FS2, each of first support units SU1-3 may include four line segments corresponding to a quadrangular shape and corner portions connecting the line segments. Each of the corner portions of the first support units SU1-3 may have a rounded shape.

In a case where the corner portions have an angled shape corresponding to a bent portion where straight lines are connected in a polygonal shape, the mask frame MF that is in contact with the corner portions may be damaged. In case that the corner portions have the rounded shape, the mask frame MF may not be damaged even though the mask frame MF is in contact with the corner portions.

When viewed in the direction toward the second front surface FS2, the first support units SU1-3 may have a size smaller than a size of the corner portions CNP, may overlap the corner portions CNP, and may be disposed in the corner portions CNP.

Figure 13:
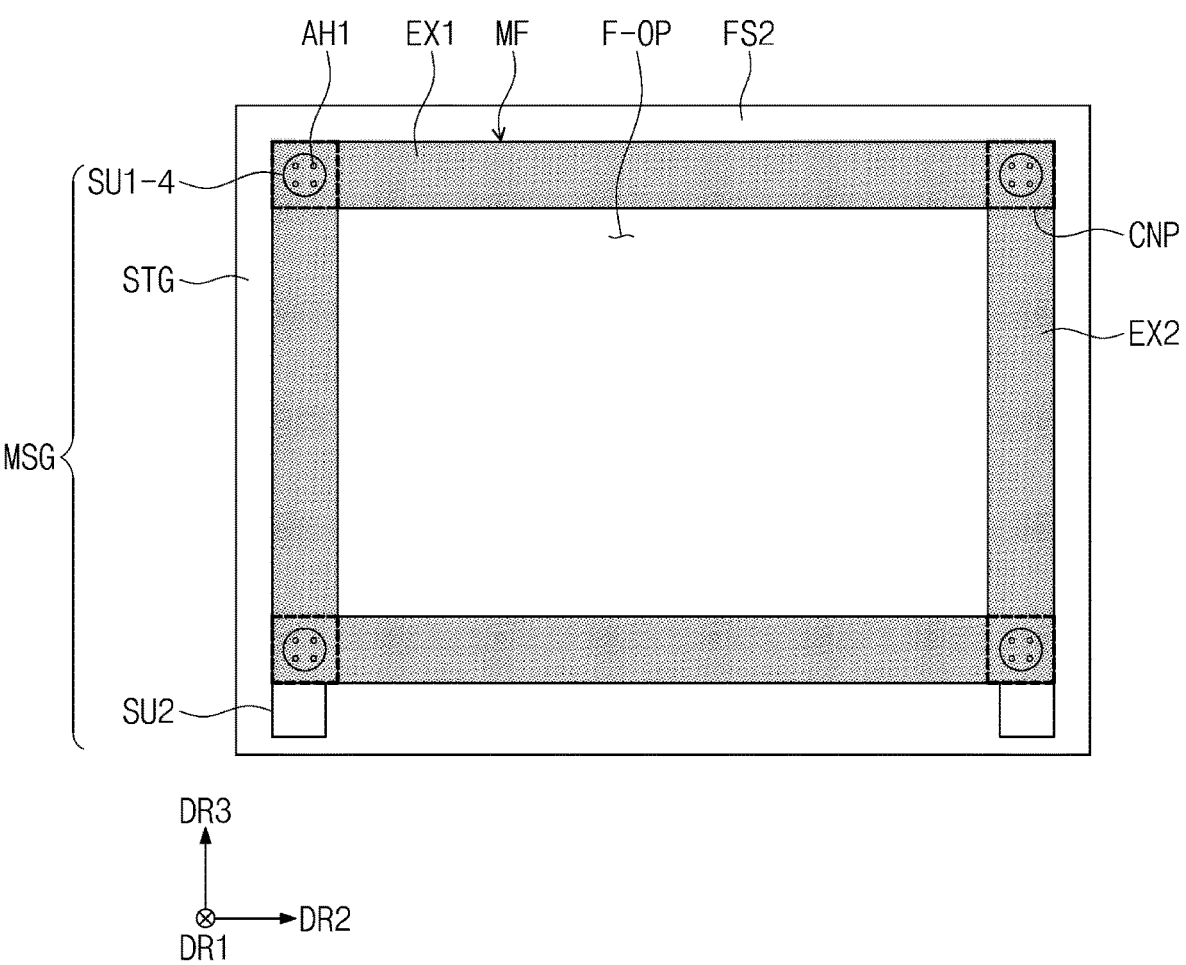

Referring to FIG. 13, when viewed in a direction toward a second front surface FS2, each of first support units SU1-4 may have a circular shape. Since the first support units SU1-4 with the circular shape do not have angled corner portions, the mask frame MF may be certainly prevented from being damaged.

When viewed in the direction toward the second front surface FS2, the first support units SU1-4 may have a size smaller than a size of corner portions CNP, may overlap the corner portions CNP, and may be disposed in the corner portions CNP.

Figure 14:
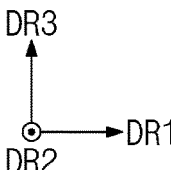
FIG. 14 is a schematic view of a deposition apparatus including a mask manufactured by the mask manufacturing apparatus shown in FIG. 1.

FIG. 14 is a schematic view of a deposition apparatus EPA including a mask MSK manufactured by the mask manufacturing apparatus shown in FIG. 1.

Referring to FIG. 14, the deposition apparatus EPA may be a vertical-type deposition apparatus. The deposition apparatus EPA may include a chamber CH, a substrate stage S-STG, the mask MSK, a crucible CR, and nozzles NZ. The chamber CH may be a vacuum chamber. The substrate stage S-STG, the mask MSK, the crucible CR, and the nozzles NZ may be placed in the chamber CH.

Each of the substrate stage S-STG, the mask MSK, and the crucible CR may be disposed parallel to the third direction DR3. The substrate stage S-STG, the mask MSK, and the crucible CR may be arranged in the first direction DR1. The mask MSK may be disposed between the substrate stage S-STG and the crucible CR.

The nozzles NZ may be connected to a surface of the crucible CR, which faces the mask MSK. For example, a deposition material DPM may be provided in the crucible CR, and a heating wire to heat the deposition material may be placed in the crucible CR.

A substrate SUB may be placed on the substrate stage S-STG. The substrate SUB may be disposed between the substrate stage S-STG and the mask MSK. The stick masks MK may be placed on the substrate SUB. The stick masks MK may be disposed between the mask frame MF and the substrate SUB.

The deposition material DPM heated in the crucible CR may be vaporized, and the vaporized deposition material DPM may be sprayed through the nozzles NZ. The deposition material DPM may be provided onto the substrate SUB through the frame opening F-OP and the openings OP (refer to FIG. 8) passing through the stick masks.

Figure 15:
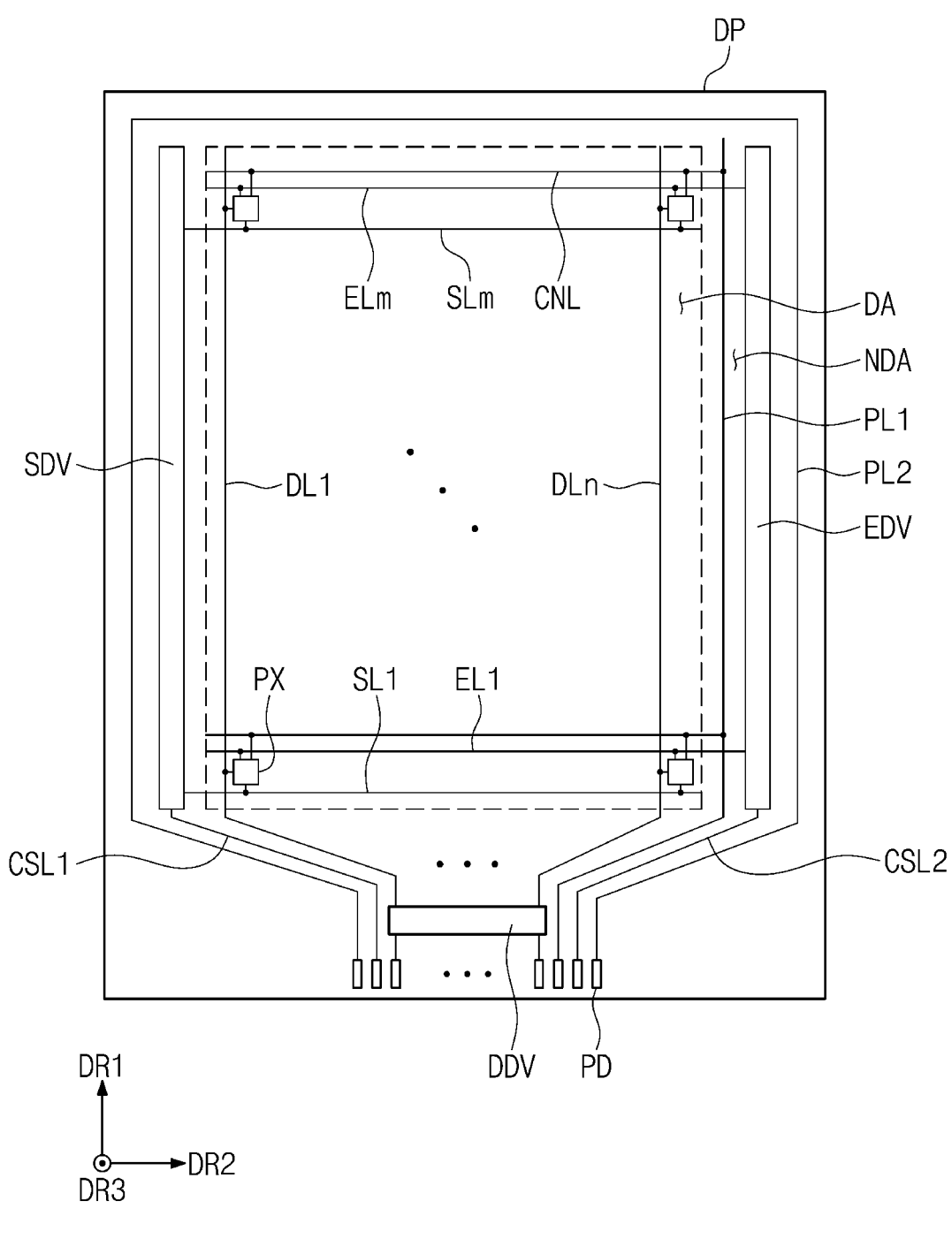
FIG. 15 is a schematic plan view of a display panel manufactured by using the deposition apparatus shown in FIG. 14.

FIG. 15 is a schematic plan view of a display panel DP manufactured by using the deposition apparatus shown in FIG. 14.

Referring to FIG. 15, the display panel DP may have a rectangular shape defined by long sides extending in the first direction DR1 and short sides extending in the second direction DR2, however, the shape of the display panel DP is not limited to the rectangular shape. The display panel DP may include a display part DA and a non-display part NDA surrounding the display part DA.

The display panel DP may be a light-emitting type display panel. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as a representative example of the display panel DP.

The display panel DP may include pixels PX, scan lines SL1 to SLm, data lines DL1 to DLn, emission lines EL1 to ELm, first and second control lines CSL1 and CSL2, first and second power lines PL1 and PL2, connection lines CNL, and pads PD. Each of m and n is a natural number.

The pixels PX may be arranged in the display part DA. A scan driver SDV and an emission driver EDV may be disposed in the non-display part NDA to be respectively adjacent to the long sides of the display panel DP. A data driver DDV may be disposed in the non-display part NDA to be adjacent to a short side of the short sides of the display panel DP. When viewed in a plane, the data driver DDV may be disposed to be adjacent to a lower end portion of the display panel DP.

The scan lines SL1 to SLm may extend in a direction opposite to the second direction DR2 and may be connected to the pixels PX and the scan driver SDV. The data lines DL1 to DLn may extend in a direction opposite to the first direction DR1 and may be connected to the pixels PX and the data driver DDV. The emission lines EL1 to ELm may extend in the second direction DR2 and may be connected to the pixels PX and the emission driver EDV.

The first power line PL1 may extend in the first direction DR1 and may be disposed in the non-display part NDA. The first power line PL1 may be disposed between the display part DA and the emission driver EDV, however, embodiments are not limited thereto or thereby. For example, the first power line PL1 may be disposed between the display part DA and the scan driver SDV.

The connection lines CNL may extend in the second direction DR2 and may be arranged in the first direction DR1. The connection lines CNL may be connected to the first power line PL1 and the pixels PX. A first voltage may be applied to the pixels PX through the first power line PL1 and the connection lines CNL connected to the first power line PL1.

The second power line PL2 may be disposed in the non-display part NDA. The second power line PL2 may extend along the long sides of the display panel DP and a short side of the display panel DP at which the data driver DDV is not disposed. The second power line PL2 may be disposed outside the scan driver SDV and the emission driver EDV.

For example, the second power line PL2 may extend to the display part DA and may be connected to the pixels PX. A second voltage having a level lower than a level of the first voltage may be applied to the pixels PX through the second power line PL2.

The first control line CSL1 may be connected to the scan driver SDV and may extend toward the lower end portion of the display panel DP when viewed in the plane. The second control line CSL2 may be connected to the emission driver EDV and may extend toward the lower end portion of the display panel DP when viewed in the plane. The data driver DDV may be disposed between the first control line CSL1 and the second control line CSL2.

The pads PD may be arranged on the display panel DP. The pads PD may be arranged closer to the lower end portion of the display panel DP than the data driver DDV is. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Each of the cell areas CA shown in FIG. 8 may correspond to the display panel DP shown in FIG. 15. Light emitting elements of a display panel DP may be formed by using a cell area CA. Light emitting elements of display panels DP may be formed by using the cell areas CA of the stick masks MK.

Unit areas corresponding to the display panels DP may be defined in the above-described substrate SUB. In case that the light emitting elements are formed in the unit areas, the unit areas may be cut. Accordingly, the display panel DP shown in FIG. 15 may be manufactured.

For example, a timing controller controlling an operation of the scan driver SDV, the data driver DDV, and the emission driver EDV and a voltage generator generating the first and second voltages may be disposed on a printed circuit board. The timing controller and the voltage generator may be connected to corresponding pads PD via the printed circuit board.

The scan driver SDV may generate scan signals, and the scan signals may be applied to the pixels PX via the scan lines SL1 to SLm. The data driver DDV may generate data voltages, and the data voltages may be applied to the pixels PX via the data lines DL1 to DLn. The emission driver EDV may generate emission signals, and the emission signals may be applied to the pixels PX via the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Figure 16:
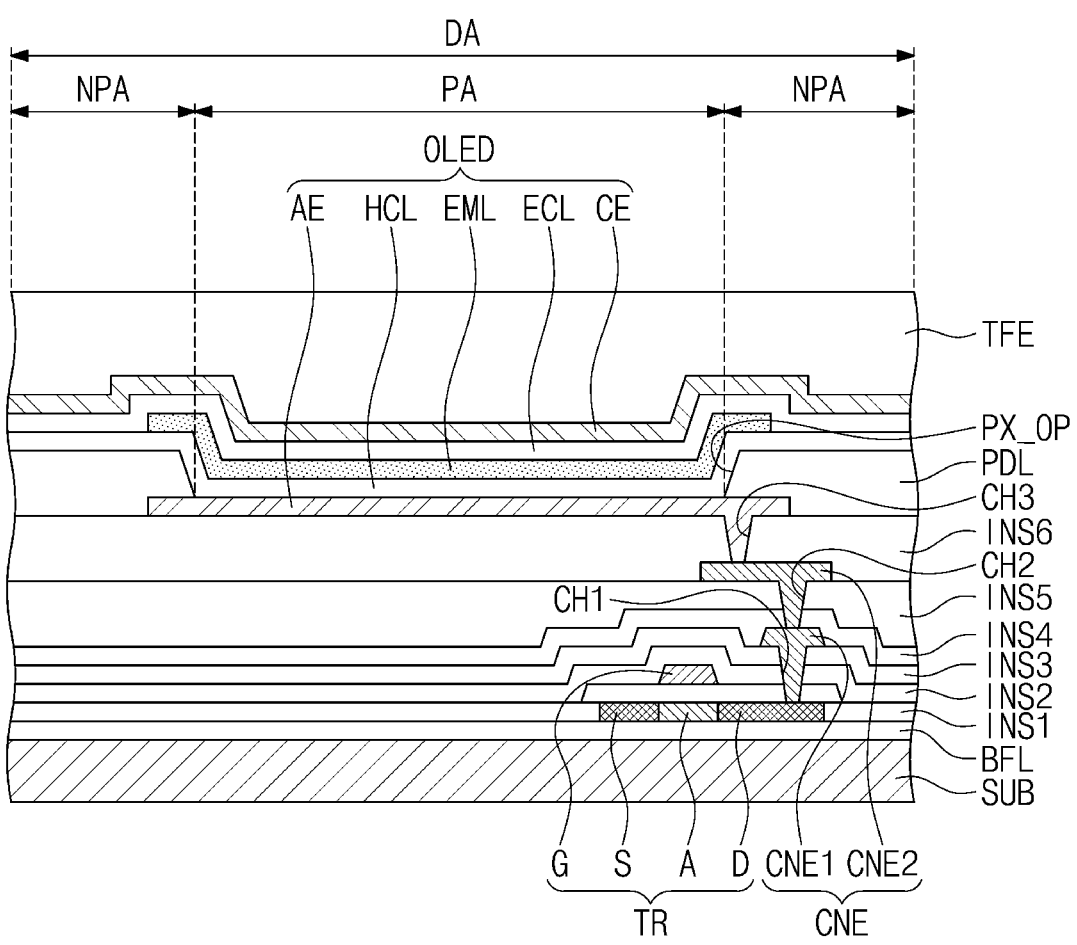
FIG. 16 is a schematic cross-sectional view of a pixel shown in FIG. 15.

FIG. 16 is a schematic cross-sectional view of the pixel PX shown in FIG. 15.

Referring to FIG. 16, the pixel PX may be disposed on the substrate SUB and may include a transistor TR and a light emitting element OLED. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. In FIG. 16, a transistor TR is shown as a representative example, however, the pixel PX may include transistors and at least one capacitor to drive the light emitting element OLED.

The display part DA may include a light emitting part PA corresponding to the pixel PX and a non-light-emitting part NPA around the light emitting part PA. The light emitting element OLED may be disposed in the light emitting part PA.

A buffer layer BFL may be disposed on the substrate SUB, and the buffer layer BFL may be an inorganic layer. A semiconductor pattern may be disposed on the buffer layer BFL. The semiconductor pattern may include a polycrystalline silicon, however, embodiments are not limited thereto or thereby. The semiconductor pattern may include amorphous silicon or metal oxide.

The semiconductor pattern may be doped with an N-type dopant or a P-type dopant. The semiconductor pattern may include a high-doped region and a low-doped region. The high-doped region may have a conductivity greater than a conductivity of the low-doped region and may substantially function as a source electrode and a drain electrode of the transistor TR. The low-doped region may substantially correspond to an active (or a channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may be disposed between the transistor TR and the light emitting element OLED to connect the transistor TR to the light emitting element OLED. The connection electrode CNE may include a first connection electrode CNE1 and a second connection electrode CNE2.

The first connection electrode CNE1 may be disposed on the third insulating layer INS3 and may be connected to the drain D via a first contact hole CH1 passing through the first, second, and third insulating layers INS1, INS2, and INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth insulating layer INS5 and may be connected to the first connection electrode CNE1 via a second contact hole CH2 passing through the fifth insulating layer INS5. A sixth insulating layer INS6 may be disposed on the second connection electrode CNE2. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 via a third contact hole CH3 passing through the sixth insulating layer INS6. A pixel definition layer PDL may be disposed on the first electrode AE and the sixth insulating layer INS6 to expose a predetermined portion of the first electrode AE. The pixel definition layer PDL may be provided with an opening PX_OP passing therethrough to expose the portion of the first electrode AE.

The hole control layer HCL may be disposed on the first electrode AE and the pixel definition layer PDL. The hole control layer HCL may be commonly disposed in the light emitting part PA and the non-light-emitting part NPA. The hole control layer HCL may include a hole transport layer and a hole injection layer.

The light emitting layer EML may be disposed on the hole control layer HCL. The light emitting layer EML may be disposed in an area corresponding to (or overlapping) the opening PX_OP. The light emitting layer EML may include an organic material and/or an inorganic material. The light emitting layer EML may generate a light having one of red, green, and blue colors.

The electron control layer ECL may be disposed on the light emitting layer EML and the hole control layer HCL. The electron control layer ECL may be commonly disposed in the light emitting part PA and the non-light-emitting part NPA. The electron control layer ECL may include an electron transport layer and an electron injection layer. The second electrode CE may be disposed on the electron control layer ECL. The second electrode CE may be commonly disposed in the pixels PX.

A thin film encapsulation layer TFE may be disposed on the light emitting element OLED. The thin film encapsulation layer TFE may be disposed on the second electrode CE to cover the pixel PX. The thin film encapsulation layer TFE may include at least two inorganic layers and an organic layer disposed between the inorganic layers. The inorganic layer may protect the pixel PX from moisture and oxygen. The organic layer may protect the pixel PX from a foreign substance such as dust particles.

The first voltage may be applied to the first electrode AE via the transistor TR, and the second voltage, which has a voltage level lower than a voltage level of the first voltage, may be applied to the second electrode CE. Holes and electrons injected into the light emitting layer EML may be recombined to generate excitons, and the light emitting element OLED may emit the light by the excitons that return to a ground state from an excited state.

Figure 17:
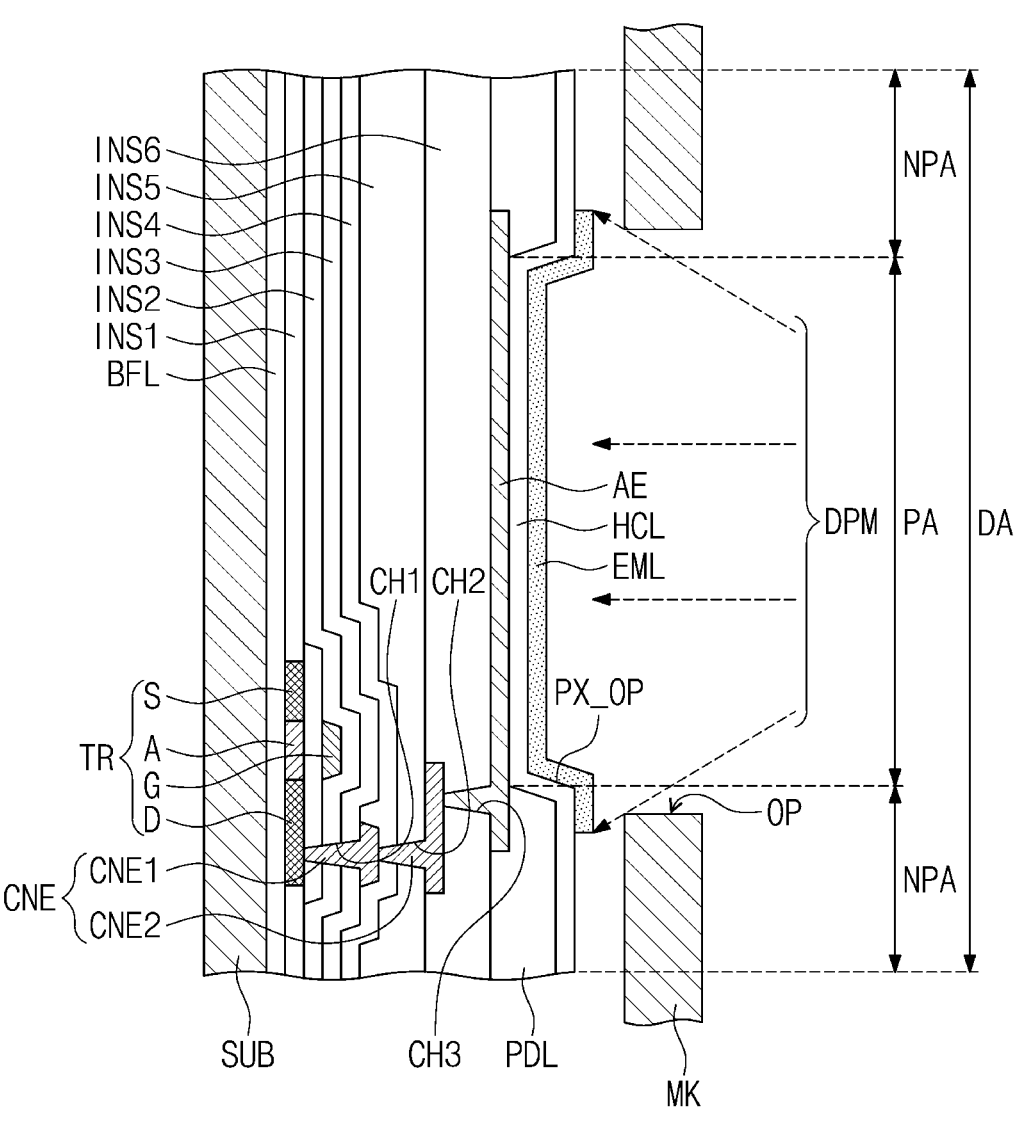
FIG. 17 is a schematic cross-sectional view illustrating a process of forming a light emitting layer shown in FIG. 16.

FIG. 17 is a schematic view illustrating a process of forming the light emitting layer shown in FIG. 16.

Referring to FIG. 17, the stick mask MK may be disposed on the substrate SUB. The deposition material DPM may be provided onto the substrate SUB via the opening OP passing through the stick mask MK. The light emitting layer EML may be formed on the substrate SUB by the deposition material DPM.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A mask stage comprising:
a stage inclined with respect to a vertical direction perpendicular to a plane defined by a first direction and a second direction intersecting each other;
a plurality of first support units disposed between the stage and a mask frame disposed above the stage; and
a plurality of second support units disposed on the stage and being adjacent to a lower side of the mask frame, wherein
the lower side of the mask frame extends in a first direction, and the plurality of second support units are respectively disposed on end portions of the lower side of the mask frame, which are opposite to each other in the first direction,
wherein each of the plurality of first support units includes a first air hole passing therethrough, portions of the stage, which respectively overlap the plurality of first support units, include a second air hole passing therethrough and overlapping the first air hole.

2. The mask stage of claim 1, wherein
the mask frame has a frame shape when viewed in a direction toward the stage, and
the plurality of first support units overlap corner portions of the mask frame.

3. The mask stage of claim 2, wherein the plurality of first support units are spaced apart from edge portions of the corner portions of the mask frame and disposed in the corner portions of the mask frame when viewed in the direction toward the stage.

4. The mask stage of claim 2, wherein the plurality of first support units do not overlap the mask frame except for the corner portions of the mask frame when viewed in the direction toward the stage.

5. The mask stage of claim 2, wherein
the mask frame comprises:
first extension portions extending parallel to each other in the first direction; and
second extension portions bent from the first extension portions, extending parallel to each other in a second direction intersecting the first direction,
the first extension portions and the second extension portions form a quadrangular frame shape together, and
the corner portions of the mask frame are defined as angled portions between the first extension portions and the second extension portions.

6. The mask stage of claim 5, wherein the plurality of first support units have a quadrangular shape when viewed in the direction toward the stage.

7. The mask stage of claim 6, wherein
the plurality of first support units comprise sides, and
each of the sides of the plurality of first support units has a length smaller than a width of each of the first extension portions and the second extension portions.

8. The mask stage of claim 7, wherein
the width of each of the first extension portions and the second extension portions is about 180 mm, and
the length of each of the sides of the plurality of first support units is about 100 mm.

9. The mask stage of claim 1, wherein the stage is inclined at an angle from about 4 degrees to about 6 degrees with respect to the vertical direction.

10. The mask stage of claim 1, further comprising:
a coating layer coated on a surface of each of the plurality of first support units and the plurality of second support units.

11. The mask stage of claim 10, wherein the coating layer is a diamond-like carbon coating layer, a silicon coating layer, or a fluorine coating layer.

12. The mask stage of claim 1, wherein the plurality of first support units and the plurality of second support units comprise a steel material.

13. The mask stage of claim 1, wherein
each of the plurality of first support units comprises four line segments corresponding to a quadrangular shape and corner portions connecting the line segments, and
each of the corner portions has a rounded shape when viewed in a direction toward the stage.

14. The mask stage of claim 1, wherein each of the plurality of first support units has a circular shape when viewed in a direction toward the stage.

15. A mask stage comprising:

a stage inclined with respect to a vertical direction perpendicular to a plane defined by a first direction and a second direction intersecting each other;

a plurality of first support units disposed between the stage and a mask frame disposed above the stage; and a plurality of second support units adjacent to a lower side of the mask frame, wherein the mask frame has a frame shape when viewed in a direction toward the stage, the plurality of first support units overlap corner portions of the mask frame, and the plurality of first support units do not overlap the mask frame except for the corner portions of the mask frame when viewed in the direction toward the stage, wherein each of the plurality of first support units includes a first air hole passing therethrough, portions of the stage, which respectively overlap the plurality of first support units, include a second air hole passing therethrough and overlapping the first air hole, and an air is sprayed to the mask frame through the first air hole and the second air hole.

16. The mask stage of claim 15, wherein the lower side of the mask frame extends in a direction, and the plurality of second support units are respectively adjacent to end portions of the lower side of the mask frame, which are opposite to each other in the direction.

17. A mask manufacturing apparatus comprising:

a first supporter comprising a plane defined by a first direction and a second direction intersecting the first direction;

a second supporter disposed on the first supporter and inclined with respect to a third direction perpendicular to the plane;

a stage disposed on a front surface of the second supporter and inclined with respect to the third direction;

a plurality of first support units disposed between the stage and a mask frame disposed above the stage; and a plurality of second support units adjacent to a lower side of the mask frame, wherein the lower side of the mask frame extends in a direction, and the plurality of second support units are respectively disposed under end portions of the lower side of the mask frame, which are opposite to each other in the direction, wherein each of the plurality of first support units includes a first air hole passing therethrough, portions of the stage, which respectively overlap the plurality of first support units, include a second air hole passing therethrough and overlapping the first air hole.

\* \* \* \* \*